United States Patent [19]

Huang

[11] Patent Number: 5,206,545
[45] Date of Patent: Apr. 27, 1993

[54] METHOD AND APPARATUS FOR PROVIDING OUTPUT CONTENTION RELIEF FOR DIGITAL BUFFERS

[75] Inventor: Eddy C. Huang, San Jose, Calif.

[73] Assignee: VLSI Technology, Inc., San Jose, Calif.

[21] Appl. No.: 650,512

[22] Filed: Feb. 5, 1991

[51] Int. Cl.⁵ .............................................. H03K 17/16
[52] U.S. Cl. .................................. 307/443; 307/473; 307/451
[58] Field of Search .............. 307/443, 263, 451, 448, 307/473

[56] References Cited

U.S. PATENT DOCUMENTS

| | | | |
|---|---|---|---|
| 4,477,741 | 10/1984 | Moser, Jr. | 307/443 |
| 4,857,770 | 8/1989 | Partovi et al. | 307/443 |
| 4,885,485 | 12/1989 | Leake et al. | 307/443 |
| 4,992,676 | 2/1991 | Gerosa et al. | 307/263 |
| 5,034,637 | 7/1991 | Jungert | 307/443 |
| 5,049,765 | 9/1991 | Young et al. | 307/446 |

Primary Examiner—Paul M. Dzierzynski
Assistant Examiner—Tan Dinh
Attorney, Agent, or Firm—The Hickman Law Firm

[57] ABSTRACT

A digital output buffer including a driver capable of driving an output signal up to a maximum drive level and a driver controller responsive to contention at the driver's output and operative to reduce the drive of the driver below the maximum drive level when contention is detected. The method for reducing contention at the output of a digital buffer includes the steps of sensing the desired output of a digital buffer, sensing the actual state at an output node of the digital buffer and reducing the output drive of the digital buffer when the desired output is in contention with the actual state at the output node.

20 Claims, 2 Drawing Sheets

METHOD AND APPARATUS FOR PROVIDING OUTPUT CONTENTION RELIEF FOR DIGITAL BUFFERS

BACKGROUND OF THE INVENTION

This invention relates generally to electronic circuitry and more particularly to electronic digital output buffers.

Digital buffers are used to provide buffered logic levels at relatively high output currents to drive external digital devices. In metal-oxide semiconductor field effect transistor (MOSFET) and complementary metal-oxide semiconductor (CMOS) digital circuitry, both the inputs and the outputs to a digital buffer are typically in the 0–5 volt d.c. range, where 0 volts (ground) represents a LO logic state and 5 volts represents a HI logic state. A type of digital buffer having a third, high impedance output state is known as a tri-state buffer. A digital output buffer often performs an inverting function so that the output of the buffer is the opposite logic state as the input to the buffer.

Digital electronic circuits typically include data, control, and address busses as well as individual data lines which carry information throughout the circuitry. Many tri-state buffers are typically coupled to each of the data and bus lines. Ideally, only one buffer connected to a data or bus line should be active at a particular time, to prevent contention among the buffers on that line. In other words, when a buffer coupled to a data or bus line is active, i.e. trying to drive that line HI or LO, all of the other output buffers coupled to that line should be in their high-impedance or tri-state.

Unfortunately, an output buffer is sometimes activated before a previously activated output buffer has been tri-stated, causing output contention on the data or bus line. If, for example, an activated output buffer is attempting to drive a line HI, while the previously activated output buffer is still pulling the line LO, large currents will flow through the activated output buffer, through the bus line, and through the previously activated output buffer. If the newly activated output buffer is attempting to pull the bus line LO, and if a previously activated buffer is still pulling the bus line HI, excessive currents will likewise flow through the two buffers via the common data or bus line.

This output contention situation not only causes excessive power consumption by the digital electronic circuitry but it can also cause a subsequent Ldi/dt power supply disturbance as the large current caused by the contention abruptly ceases when the previously activated buffer tri-states. This power supply disturbance can cause transients within the circuit, possibly disturbing the performance or even damaging components of the circuitry.

The prior art, therefore, does not adequately address the problem of output contention between the digital output buffers of a digital electronic circuit.

SUMMARY OF THE INVENTION

A digital output buffer having output contention relief includes a driver capable of driving an output signal up to a maximum drive level in response to an input signal, and a driver controller which senses contention at the output of the driver. When contention is sensed, the driver controller reduces the drive of the driver below the maximum drive level until the contention is resolved. When the output signal of the driver is no longer in contention with the output of the driver, the driver controller permits the driver to produce the maximum drive level on the output.

The driver preferably includes a pull-up driver and a pull-down driver. Preferably, the pull-up driver is controlled by a first input node voltage while the pull-down driver is controlled by a second input node voltage. By deactivating both the pull-up driver and the pull-down driver the output of the digital output buffer can be tri-stated.

The method of the present invention includes the steps of sensing the desired output of a digital buffer, sensing the actual state at an output node of the digital buffer, and reducing the output drive of the digital buffer when the desired output is in contention with the actual state. In other words, when a digital buffer desires to drive an output node HI, the output drive of the buffer is reduced when a LO state is sensed at the output node. Conversely, when the digital output buffer desires to drive the output node LO but the actual state of the output node is HI, then the output drive of the output buffer is also reduced.

In consequence, the method and apparatus of the present invention are advantageous in that they greatly reduce contention between various digital output buffers connected to a single data or bus line. This reduced contention reduces the power requirements of the digital electronic circuitry and greatly reduces the chance of power supply disturbances caused by contention among the output buffers.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1:
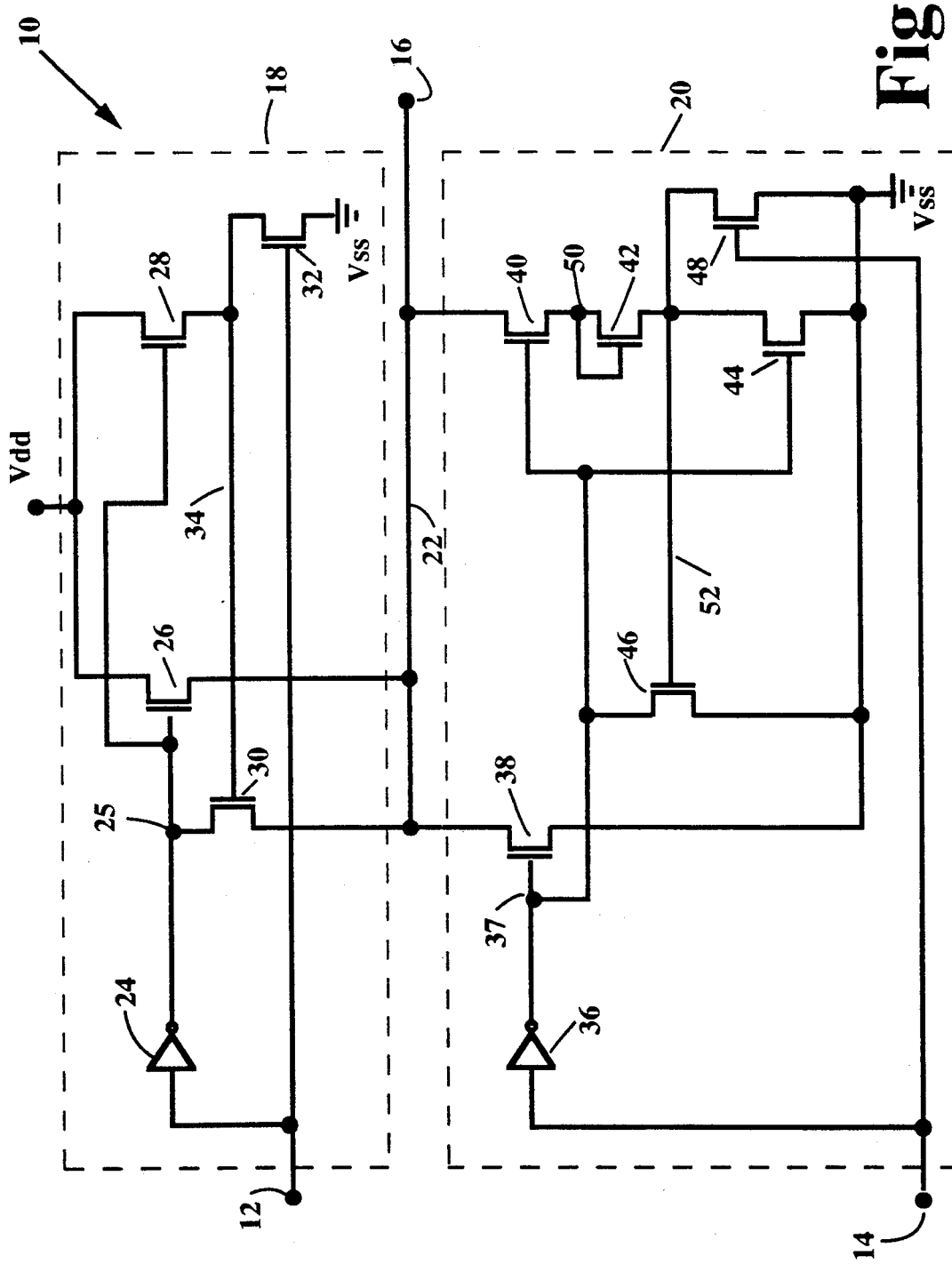
FIG. 1 is a schematic diagram of a digital output buffer in accordance with the present invention which is implemented with n-channel pull-up and pull-down circuits.

In FIG. 1, a digital output buffer 10 includes a first input node 12, a second input node 14, an output node 16, a pull-up circuit 18, and a pull-down circuit 20. The input nodes 12 and 14 are typically coupled to internal circuitry of a digital integrated circuit while the output node 16 is typically coupled to external digital circuitry such as by a bus or data line on a printed circuit board. An output line 22 terminates at output node 16 and serves as a common output line for the pull-up circuit 18 and the pull-down circuit 20.

Pull-up circuit 18 includes an inverter 24 and four n-channel MOSFETS 26, 28, 30 and 32. Inverter 24 has an input coupled to first input node 12 and an output coupled to a node 25. The gate of MOSFET 26 is coupled to node 25 and the channel of MOSFET 26 is coupled between a first voltage source $V_{dd}$ (typically 5 volts d.c.) and output line 22. The gate of MOSFET 28 is also coupled to node 25, and the channel of MOSFET 28 is coupled between $V_{dd}$ and pull-up control line 34. The gate of MOSFET 30 is coupled to pull-up control line 34 and its channel is coupled between node 25 and the output line 22. The gate of MOSFET 32 is coupled to first input node 12 and the channel of MOSFET 32 is coupled between pull-up control line 34 and a second voltage source $V_{ss}$ (typically 0 volts d.c. or ground).

Pull-down circuit 20 includes an inverter 36 and six n-channel MOSFETS 38, 40, 42, 44, 46 and 48. The input of inverter 36 is coupled to a second input node 14, while the output of the invertor 36 is coupled to a node 37. The gate of MOSFET 38 is coupled to node 37 and the channel of MOSFET 38 is coupled between output line 22 and the second voltage source $V_{ss}$. The gate of MOSFET 40 is coupled to node 37 and the channel of MOSFET 40 is coupled between output line 22 and a node 50. The gate of MOSFET 42 is coupled to node 50, and the channel of MOSFET 42 is coupled between node 50 and a pull-down control line 52. The gate of MOSFET 44 is coupled to node 37 and its channel is coupled between pull-down control line 52 and $V_{ss}$. The gate of MOSFET 46 is also coupled to pull-down control line 52 and the channel of MOSFET 46 is coupled between the node 37 and $V_{ss}$. The gate of MOSFET 48 is coupled to second input node 14, and its channel is coupled between pull-down control line 52 and $V_{ss}$.

To tri-state output node 16, a HI input signal of voltage approximately $V_{dd}$ is applied to both input nodes 12 and 14. In the pull-up circuit 18, the HI input will cause MOSFETS 26 and 28 to turn off, MOSFET 32 to turn on, and MOSFET 30 to turn off. Because both MOSFETS 26 and 30 are off the output of the pull-up circuit on output line 22 is in a high-impedance state. In pull-down circuit 20, a HI input on second input node 14 causes MOSFETS 38 and 40 to turn off so that the output of pull-down circuit 20 on output line 22 is also in a high-impedance state. Because both pull-up circuit 18 and the pull-down circuit 20 are in high-impedance states when the inputs on input nodes 12 and 14 are HI, the output node 16 of the digital output buffer 10 is effectively tri-stated.

To produce a HI output at output node 16, first input node 12 is forced LO (i.e. approximately to $V_{ss}$) while the second input node 14 remains HI. Applying a LO input signal to first input node 12 causes MOSFETS 26 and 28 to turn on, and turns off MOSFET 32. The voltage level at node 25 is approximately $V_{dd}$, while the voltage level on pull-up control line 34 is approximately $V_{dd}-V_t$, where $V_t$ is the threshold voltage of the MOSFET 28. If the output line 22 is either tri-stated or already at a HI logic level the voltage on pull-up control line 34 will be insufficient to turn on MOSFET 30. If, however, the output node 16 is being forced to a LO logic level by some external device, the voltage level on pull-up control line 34 in sufficient to turn on MOSFET 30 which pulls down node 25 to a lower voltage. This reduces the amount of current which can flow through MOSFET 26, thereby diminishing the drive of pull-up circuit 18 when its desired output is in contention with the actual logic state of output node 16. The amount of drive reduction will be directly but non-linearly related to the degree of contention at the output node 16, i.e., to the voltage difference between the logic state that the buffer is attempting to develop on the output node 16 and the actual logic state on the output node 16, and to the size of MOSFET 30. When the external device which was pulling output node 16 to a LO logic level goes to its high-impedance state, MOSFET 30 turns off. This allows MOSFET 26 to provide the maximum amount of current to flow through output line 22 so that the pull-up circuit 18 is providing its maximum drive level. The MOSFET 32 is provided to ensure that MOSFET 30 is always off whenever pull-up circuit 18 is disabled by a HI input on first node 12.

To develop a LO output at output node 16, first input node 12 is forced HI and second input node 14 is forced LO. This causes MOSFET 38 to turn on which attempts to pull output line 22 to $V_{ss}$ or LO. If the actual state on output node 16 is HI due to some external device, a voltage greater than the threshold voltage of MOSFET 46 will be developed on pull-down control line 52, thereby turning on MOSFET 46. This, in turn, pulls down the voltage level of node 37, reducing the amount of current which can flow through MOSFET 38. Again, the amount of drive reduction will be directly but non-linearly related to the level of contention at output node 16 and to the size of MOSFET 46. In consequence, when the output of pull-down circuit 20 is in contention with the actual logic state on output node 16, the drive of the pull-down circuit 20 is greatly reduced. When the output of pull-down circuit 20 is not in contention with the actual logic state on output node 16, i.e. the actual logic level on output node 16 is tri-stated or LO, the voltage level on pull-down control line 52 will be at or near $V_{ss}$, MOSFET 46 will be off, and the maximum drive current is permitted to flow through MOSFET 38. MOSFET 48 is provided to ensure that MOSFET 46 is off when the pull-down circuit 20 is disabled by a HI input on the second input node 14.

Figure 2:
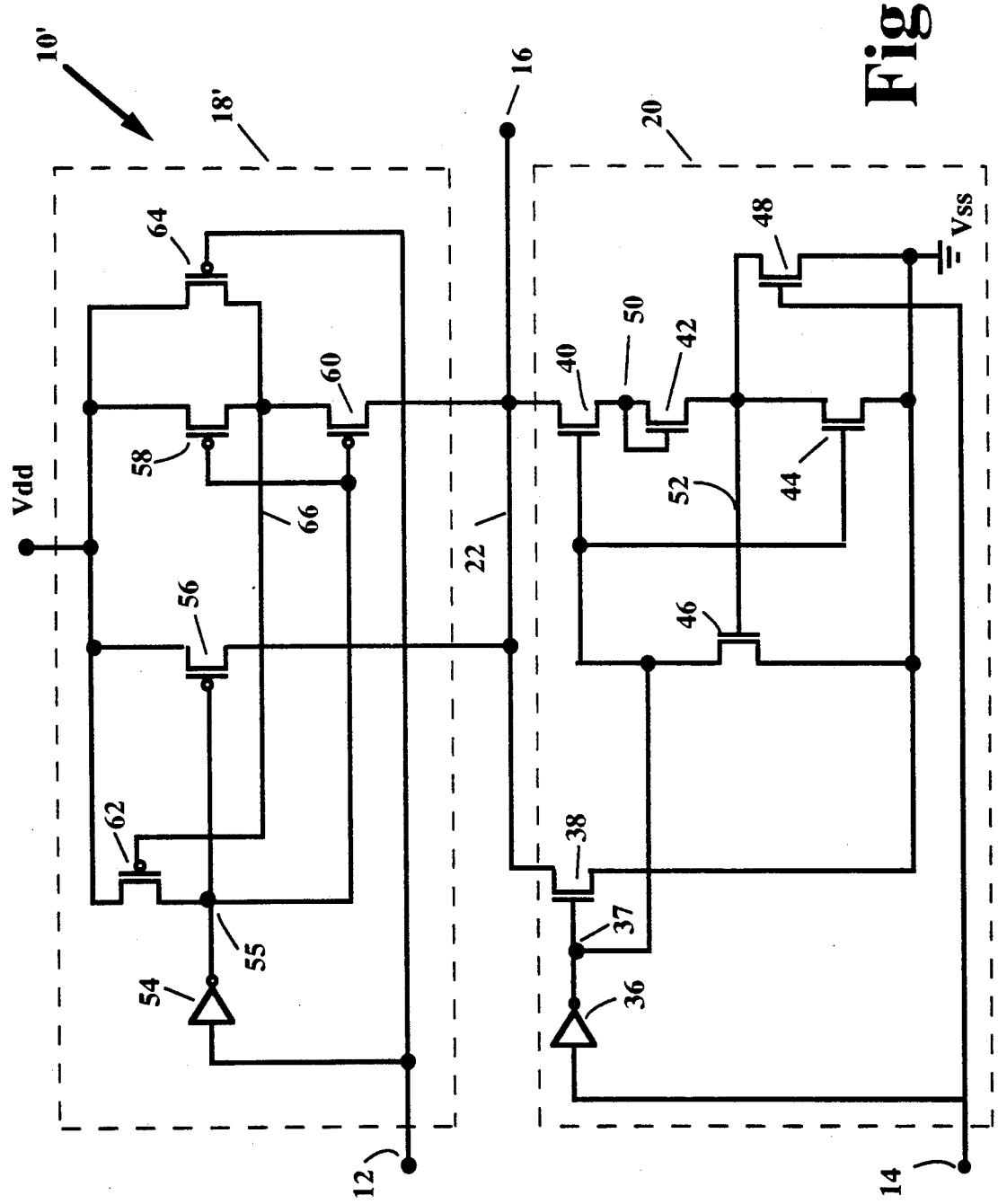
FIG. 2 is a schematic diagram of an alternate embodiment of an output digital buffer in accordance with the present invention which is implemented with a p-channel pull-up circuit and an n-channel pull-down circuit.

Referring now to FIG. 2, an alternate embodiment for a digital output buffer 10' includes a first input node 12, a second input node 14, an output node 16, a pull-up circuit 18', and a pull-down circuit 20. The pull-down circuit 20 is of similar construction and operation to the pull-down circuit 20 of digital output buffer 10 and its description will not be repeated here. The pull-up circuit 18', however, is implemented in p-channel MOSFETS so that the digital output buffer 10' can be implemented in CMOS technology.

The pull-up circuit 18' includes an inverter 54 and five-p-channel MOSFETS 56, 58, 60, 62 and 64. The input of inverter 54 is coupled to first input node 12, while the output of the inverter 54 is coupled to a node 55. The gate of MOSFET 56 is coupled to node 55 and its channel is coupled between $V_{dd}$ and the output line 22. The gates of MOSFETS 58 and 60 are also coupled to node 55. The channel of MOSFET 58 is coupled between $V_{dd}$ and pull-up control line 66, while the channel of MOSFET 60 is coupled between pull-up channel 66 and the output line 22. The gate of MOSFET 62 is coupled to pull-up control line 66 while the channel of MOSFET 62 is coupled between $V_{dd}$ and node 55. The gate of MOSFET 64 is coupled to first input node 12 and its channel is coupled between $V_{dd}$ and pull-up control line 66.

The digital output buffer 10' can be tri-stated by applying a LO logic level to first input node 12 and a HI logic level to second input node 14. When a HI logic level is applied to first input node 12, MOSFET 56 turns on causing output line 22 to be pulled towards $V_{dd}$. If, however, the logic level on output node 16 is being pulled LO by an external device, the voltage on line 66 will be pulled to approximately $V_{dd}/2$ to at least partially turn on MOSFET 62. This pulls up the voltage on node 55, reducing the amount of current flowing through MOSFET 56 and thus reducing the drive of pull-up circuit 18'. The amount of the current reduction will be directly but non-linearly related to the level of contention at output node 16 and to the size of MOSFET 62. When the external device coupled to input node 16 tri-states or goes to a HI logic level, the voltage on pull-up control line 66 will approach $V_{dd}$, turning off MOSFET 62 and permitting MOSFET 56 to supply the maximum drive level of the current to output line 22. MOSFET 64 is provided to turn off MOSFET 62 when the pull-up circuit 18' is disabled by a LO input at first input node 12.

While the first input node 12 and the second input node 14 of the digital output buffer 10' can be operated separately to provide a tri-state digital output buffer, they can also be coupled together to provide a two-state digital output buffer. When coupled together, a LO logic input level will turn off pull-up circuit 18' and turn on pull-down circuit 20 to provide a LO logic level on output node 16. A HI logic level applied to the first input node 12 and the second input node will turn on the pull-up circuit 18' and turn off the pull-down circuit 20 to provide a HI logic level on output node 16.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A digital output buffer comprising:
    input means and output means;
    driver means coupled between said input means and said output means, said driver means being adapted to drive an output signal voltage up to a maximum drive current level on said output means in response to an input signal on said input means; and
    driver control means coupled to said output means and to said driver means, said driver control means being responsive to a voltage of said output means and operative to reduce said drive current of said driver means below said maximum drive current level when said voltage of said output means is in contention with said output signal voltage of said driver means.

2. A digital output buffer as recited in claim 1, wherein said driver means is operative to pull-up said output means in response to a pull-up signal and further comprising pull-down means coupled to said output means.

3. A digital output buffer as recited in claim 2, further comprising enabling means coupled between said input means and said driver control means which is operative to enable said driver control means when said input signal is said pull-up input signal.

4. A digital output buffer as recited in claim 1, wherein said driver means is operative to pull-down said output means in response to a pull-down input signal and further comprising pull-up means coupled to said output means.

5. A digital output buffer as recited in claim 4, further comprising enabling means coupled between said input means and said driver control means which is operative to enable said driver control means when said input signal is said pull-down input signal.

6. A digital output buffer as recited in claim 1, wherein said buffer means comprises pull-up means and pull-down means each coupled between said input means and said output means and wherein said driver control means includes a pull-up control means for controlling said pull-up means and pull-down control means for controlling said pull-down means.

7. A digital output buffer as recited in claim 6, wherein said input means comprises a first input node coupled to said pull-up means and a second input node coupled to said pull-down means.

8. A digital output buffer as recited in claim 3, further comprising pull-up control enabling means operative to enable said pull-up control means when a pull-up signal is present at said first input node and pull-down control enabling means operative to enable said pull-down control means when a pull-down signal is present at said second input node.

9. A digital output buffer comprising:
    a first input node, a second input node and an output node;
    pull-up means coupled between said first input node and said output node, said pull-up means being adapted to pull-up said output node voltage with a maximum pull-up drive current in response to a pull-up signal on said first input node;
    pull-up control means coupled to said output node and said pull-up means, said pull-up control means being responsive to a signal state of said output node and operative to reduce said pull-up drive current when said signal state of said output node is in contention with said pull-up means;
    pull-down means coupled between said second input node and said output node, said pull-down means being adapted to pull-down said output node voltage with a maximum pull-down drive current in response to a pull-down signal on said second input node; and
    pull-down control means coupled to said output node and said pull-down means, said pull-down control means being responsive to a signal state of said output node and operative to reduce said pull-down drive current when said signal state of said output node is in contention with said pull-down means.

10. A digital output buffer as recited in claim 9, further comprising:
    pull-up control enabling means coupled between said first input and said pull-up control means which is operative to enable said pull-up control means in response to said pull-up signal and to disable said pull-up control means in the absence of said pull-up signal; and
    pull-down control enabling means coupled between said second input and said pull-down control means which is operative to enable said pull-down control means in response to said pull-down signal and to disable said pull-down control means in the absence of said pull-down signal.

11. A digital output buffer as recited in claim 9, wherein:
    said pull-up means comprises a pull-up transistor having a channel coupled between a positive power supply terminal and said output node and having a gate coupled to said first input node: and
    said pull-down means comprises a pull-down transistor having a channel coupled between a negative power supply terminal and said output node and having a gate coupled to said second input node.

12. A method for reducing contention at the output of a digital buffer comprising:
    sensing the desired output voltage of a digital buffer;

sensing the actual state voltage at an output node of said digital buffer; and reducing the output drive current of said digital buffer when said desired output is in contention with said actual state.

13. A method as recited in claim 12, wherein said step of sensing the desired output comprises sensing a desired HI output of said digital buffer and wherein said step of reducing said output drive comprises reducing said output drive when a LO state is sensed at said output node.

14. A method as recited in claim 12, wherein said step of sensing the desired output comprises sensing a desired LO output of said digital buffer and wherein said step of reducing said output drive comprises reducing said output drive when a HI state is sensed at said output node.

15. A method as recited in claim 13, wherein said step of sensing the desired output comprises sensing a desired LO output of said digital buffer and wherein said step of reducing said output drive comprises reducing said output drive when a HI state is sensed at said output node.

16. A digital output buffer comprising:

voltage pull-up means having a pull-up input terminal and an output terminal, for receiving a pull-up input signal and for producing and issuing an output signal determined in part by said pull-up input signal received;

voltage pull-down means having a pull-down input signal and having a common output terminal with said voltage pull-up means, for receiving a pull-down input signal and for producing and issuing an output signal determined in part by said pull-down input signal received;

where each of said pull-up input signal and said pull-down input signal has either of two voltages, a high voltage and a low voltage, and said output terminal issues either of two voltages, a high voltage or a low voltage, in response to said input signals received by said pull-up means and said pull-down means;

where said output terminal has a high output impedance when said pull-up input signal and said pull-down input signal are first and second selected input signals, respectively;

where, if said pull-up means is producing a high voltage output signal and said pull-down means begins producing a low voltage output signal so that said pull-down means is in contention with said pull-up means, said pull-up means produces a reduced output current, relative to the maximum output current available, at said output terminal; and where, if said pull-down means is producing a low voltage output signal and said pull-up means begins producing a high voltage output signal so that said pull-up means is in contention with said pull-down means, said pull-down means produces a reduced output current, relative to the maximum output current available, at said output terminal.

17. A digital output buffer as recited in claim 16, wherein said pull-up means reduces said output current by an amount that monotonically increases with the difference between said voltage produced by said pull-up means and said voltage produced by said pull-down means, when said pull-down means is in contention with said pull-up means.

18. A digital output buffer as recited in claim 16, wherein said pull-down means reduces said output current by an amount that monotonically increases with the difference between said voltage produced by said pull-down means and said voltage produced by said pull-up means, when said pull-up means is in contention with said pull-down means.

19. A digital output buffer as recited in claim 16, wherein said first selected input signal and said second selected input signal have a high voltage and a high voltage, respectively.

20. A digital output buffer as recited in claim 16, wherein said first selected input signal and said second selected input signal have a low voltage and a high voltage, respectively.

* * * * *